United States Patent [19]
Gris

[11] Patent Number: 5,068,630
[45] Date of Patent: Nov. 26, 1991

[54] MULTIPLE COUPLER DEVICE WITH RETURN PATH

[75] Inventor: Joël Gris, Louviers, France

[73] Assignee: U.S. Philips Corporation, New York, N.Y.

[21] Appl. No.: 450,759

[22] Filed: Dec. 14, 1989

[30] Foreign Application Priority Data

Dec. 27, 1988 [FR] France .................. 88 17226
Dec. 27, 1988 [FR] France .................. 88 17228

[51] Int. Cl.$^5$ ............................................. H03H 7/48
[52] U.S. Cl. ..................................... 333/100; 333/116; 333/126; 333/129
[58] Field of Search ............... 333/100, 109, 116, 124, 333/125, 126, 129, 132, 134, 136

[56] References Cited

U.S. PATENT DOCUMENTS

| | | | |
|---|---|---|---|
| 3,619,504 | 11/1971 | DeVeer et al. | 333/109 X |
| 4,156,212 | 5/1979 | Covill | 333/100 |
| 4,423,392 | 12/1983 | Wolfson | 333/116 |

Primary Examiner—Paul Gensler
Attorney, Agent, or Firm—Michael E. Marion

[57] ABSTRACT

A multiple coupler which comprises a low-pass path (VPB) and a high-pass path (VPH) and frequency separation elements comprising a capacitive element C and an inductive element L, whose impedances $Z_c$ and $Z_l$, respectively, satisfy the relation $Z_c Z_l = Z_o^2$. The low-pass path comprises a phase inverter INV to enable recombination of the signals without any distortion.

23 Claims, 3 Drawing Sheets

5,068,630

MULTIPLE COUPLER DEVICE WITH RETURN PATH

BACKGROUND OF THE INVENTION

The invention relates to a wideband multiple coupler device having an input and a plurality of outputs of the same characteristic impedance $Z_0$, constituted by an impedance star distributor for a low-pass path, and combined with a cascade arrangement of directional couplers for a high-pass path, the outputs of these two combined devices being pair-wise dc connected to constitute said plurality of outputs.

Such a coupler device is notably used in communal antenna systems or in CATV systems. Since the frequency ranges used by the transmitters are extended, television networks should be able to transmit in the range of 40–860 MHz (VHF) and the range of 960–1750 MHz (UHF) and even in the satellite range.

Directional couplers or, in other terms, microstrip line couplers are nowadays used for realizing high-frequency coupler devices. Their drawback is a periodic response which decreases rapidly in amplitude in the proximity of the lowest transmitted frequencies. A known arrangement is described in European Patent Specification no. 0,053,675, in which arrangement a filtering operation is required which involves the existence of an intermediate range of frequencies which cannot be used. The present invention overcomes this drawback.

SUMMARY OF THE INVENTION

The instant invention comprises a multiple coupler device wherein the input of the multiple coupler device is coupled to the input of an impedance star distributor by means of a first input connection comprising an inductive impedance $Z_1$, and to the input of a cascade arrangement of directional couplers by means of a second input connection comprising a capacitive impedance $Z_c$, one of said first or second input connections being provided with a phase inverter element connected in series. The phase inverter element adjusts the phase of signals passing through a high-pass path comprising the series arrangement of directional couplers and a low-pass path comprising the impedance star distributor, throughout the frequency range utilized by the multiple coupler device, where $Z_1 \times Z_c = Z_0^2$.

The invention avoids a costly filtering operation in the separation of frequency ranges and such separation can now be realized with only two complementary components, a coil and a capacitor, which have a common cut-off frequency at half the energy and which constitute a frequency separation in two paths. The sum of the transmitted energies in each path is equal to the energy at the input of the device, which permits transmission without the loss of an intermediate unutilized frequency band. In order to compensate for the phase differences at the output of the two paths and for avoiding the amplitude distortions resulting therefrom, a simple inverter renders the phase of the two outputs exactly equal again. After they have passed through their respective coupler devices, the two signals can be summed without any discontinuity in frequency or in amplitude.

For realizing a return path below 40 MHz, an arrangement can also be used which associates an aperiodical impedance distributor with a line coupler. An arrangement of this type is also described in the before-mentioned European Patent Specification no. 0,053,675. A drawback of this arrangement is that an effective filtering operation between the two bands to be transmitted is required, on penalty of considerable distortion in the transmission. The number of components required increases the production costs. Moreover, this filtering operation creates a distance between the two bands which results in an intermediate range of useless frequencies.

A preferred embodiment is particularly characterized in that the impedance star distributor is used as a return path for transmitting signals in a direction opposite to the direction of signals transmitted by the high-pass path.

BRIEF DESCRIPTION OF THE DRAWINGS

The invention will now be described in greater detail by way of non-limitative example with reference to the accompanying drawings in which.

DETAILED DESCRIPTION OF PREFERRED EMBODIMENT OF THE INVENTION

Figure 1:
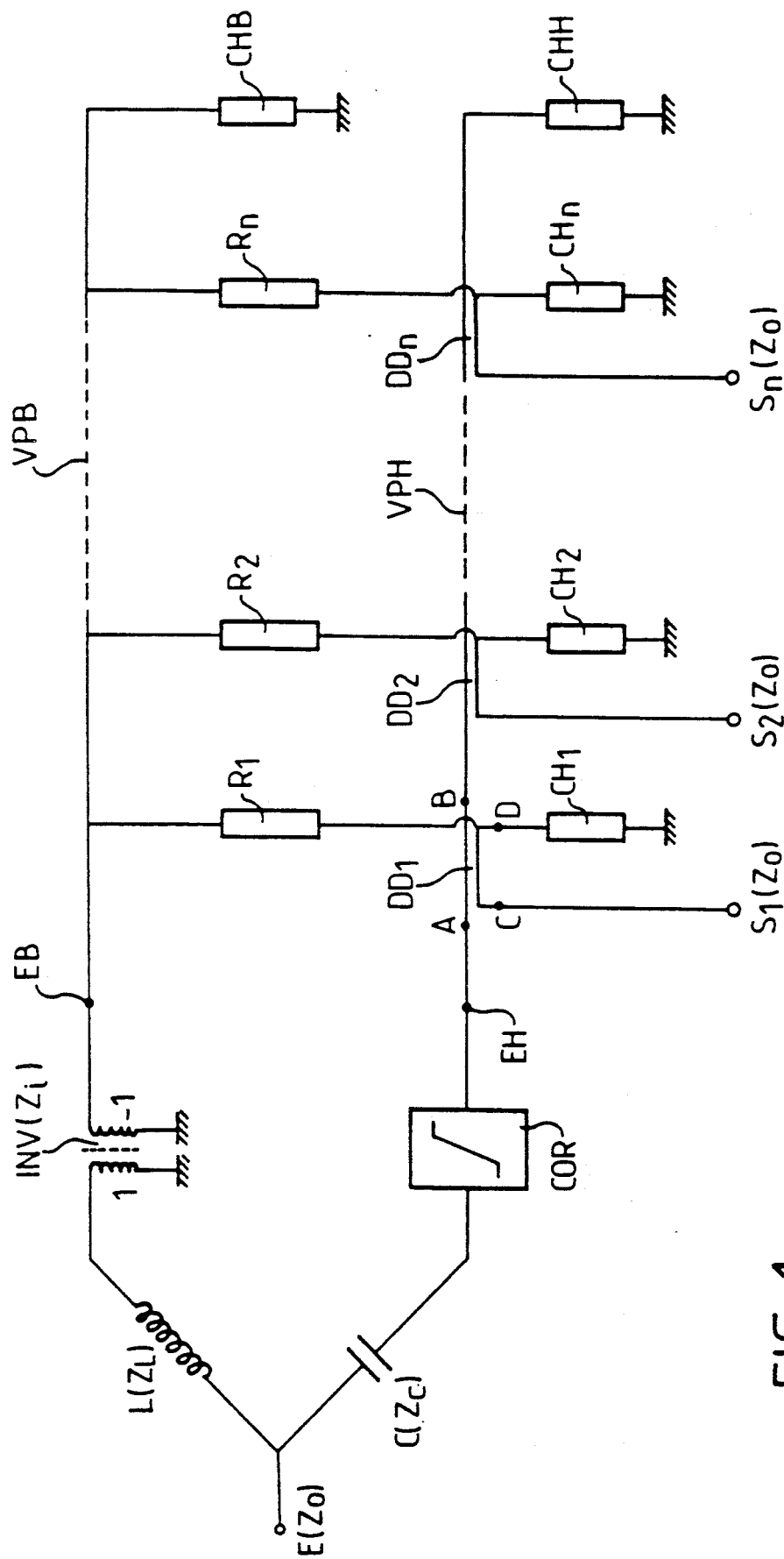
FIG. 1 shows a wideband multiple coupler device with a return path.

The coupler device shown in FIG. 1 has an input E and "n" outputs $S_1, S_2, \ldots S_n$ whose characteristic impedances are all equal to $Z_0$; the outputs are internally set at their characteristic impedances $CH_1, CH_2, \ldots CH_n$, equal to $Z_0$.

The coupler device has a low-pass path (VPB) constituted by an impedance star distributor $R_1, R_2, \ldots, R_n$ and a high-pass path (VPH) constituted by a cascade arrangement of directional couplers or, in other terms, a series of microstrip line couplers $DD_1, DD_2, \ldots, DD_n$. Each path is terminated by a load CHB, CHH; CHH is equal to $Z_0$.

The signals at the input E are separated in frequency by a capacitive element C of an impedance $Z_c$ and by an inductive element L of an impedance $Z_1$; an inverter INV of the impedance $Z_i$ is shown as a unity ratio transformer for inverting the phase, situated in the input connection of the impedance star distributor, i.e. in the low-pass path, but this is not necessary. Other inverter types such as phase-shift inverters, transistor inverters, etc., can be used and may be situated in the high-pass path.

In all cases the inverter compensates for the phase differences at all frequencies which would exist between the two paths, if it were not provided.

The phase inverter is preferably aperiodical, for example, a quadripole having 2 mutually coupled windings with an impedance $Z_i$ which is much higher than $Z_0$.

The outputs of the impedance star distributor and the cascade arrangement of directional couplers are pair-wise dc connected. Considering the four poles A, B, C, D of the quadripole $DD_1$ with pole A opposite of pole C and pole B opposite to D, pole C being connected to the output $S_1$ and pole D being connected to the common connection of $R_1$ and $CH_1$, it is preferable to connect the output of the resistor $R_1$ to the pole D, i.e. to the load resistor $CH_1$ etc.; thus all signals in the high-pass path or in the low-pass path follow the same DC path DC and are thus subjected to the same phase shift.

The two paths are thus recombined without any distortion.

The impedances $Z_c$ and $Z_1$ have values such that: $Z_c \cdot Z_1 = Z_0^2$. The capacitive element C and the inductive element L thus have a common cut-off frequency at half the signal energy and the transmission is effected without utilizing a useless intermediate frequency band, for example, between 30 and 40 MHz, so that one could now speak of the recovery frequency, rather than of the cut-off frequency.

With the above described device the signals, after passing through their respective coupler devices, are transmitted without any discontinuity in frequency or in amplitude.

With such an arrangement the term return path will become rather subjective. Since there is no longer any useless intermediate band, each frequency may circulate in any direction.

Such a coupler device can be realized with an input and eight outputs for a communal television antenna system, i.e. with $Z_0 = 75\ \Omega$ and a frequency band between 40 and 860 MHz; in this case the low-pass path constitutes the return path for the frequency signals of less than 40 MHz.

The return path is advantageously utilized for signals for pay television, remote control systems or other systems.

In this non-limitative example the values of the following components are:
L=210 nH; C=38 pF
Inverter several $\mu$Henry ($Z_i$)
$R_1, R_2, R_3, \ldots, R_8 = 1000\ \Omega$
$CH_1, CH_2, \ldots CH_8 = 75\ \Omega = CHH$
$CHB = 200\ \Omega$ The length of the coupled lines $DD_1, DD_2, \ldots, DD_8$ is approximately equal to $\lambda/8$, in this case 5 cm.

The high-pass path is provided with an amplitude correction element COR i.e. a filter which matches the response of the arrangement to that of the cable.

It is remarkable that the multiple coupler device thus realized remains perfectly operational, even if the frequency standards are modified; for example, if the frequency range of the return signals increase UP to 80 MHz, the arrangement may remain unchanged and in this case a part of the return signals will use the high-pass path.

The coupler device of FIG. 2 has an input E and a plurality of outputs $S_1, S_2, \ldots S_n$; the values of the components indicated hereinafter correspond to a coupler having 8 outputs whose line coupler is centred at 1750 MHz and whose recovery frequency is 100 MHz, which is, however, non-limitative.

For a conventional input impedance $Z_0$ of 75 $\Omega$, the outputs are set with the same value, i.e. $CH_1 = CH_2 = \ldots = CH_n = 75\ \Omega$.

The series arrangement of line couplers ($DD_1, DD_2, \ldots DD_n$) constitutes the high-pass path (VPH) which is terminated by the load CHH having a value of 75 $\Omega$.

The impedance star distributor $R_1, R_2, \ldots R_n$ constitutes the low-pass path (VPB) which is terminated by a load CHB of 200 $\Omega$; in the example chosen the resistances are equal and have the value $R_1 = R_2 = \ldots R_8 = 1000\ \Omega$.

An input $E_1$ of the high-pass path (VPH) is connected to the input E via the capacitive element C having a value of 15 pF (impedance $Z_c$).

An input $E_2$ of the low-pass path (VPB) is connected to the input E via the self-inductive element L having a value of 84 nH (impedance $Z_1$) and the inverter INV. The values $Z_c$ and $Z_1$ are chosen such that
on the one hand $Z_c Z_1 = Z_0^2$
on the other hand the recovery frequency is equal to 100 MHz.

The inverter INV is a unity ratio transformer for phase inversion.

The inverter INV whose impedance $Z_i$ is much higher than $Z_0$ permits of summing the signals without any distortion at the output, which signals follow the two different paths VPB and VPH, notably for the recovery frequency.

If the quadripole A, B, C, D constituted by the line coupler $DD_1$ is considered, it is advantageous that the resistor $R_1$ is connected to the pole D rather than to the pole C; thus all signals in either the high-pass path or the low-pass path follow the same DC path and are thus subjected to the same phase shift.

This also applies to the other quadripoles $DD_2, \ldots DD_n$ and the resistors $R_2, \ldots R_n$.

Figure 2:
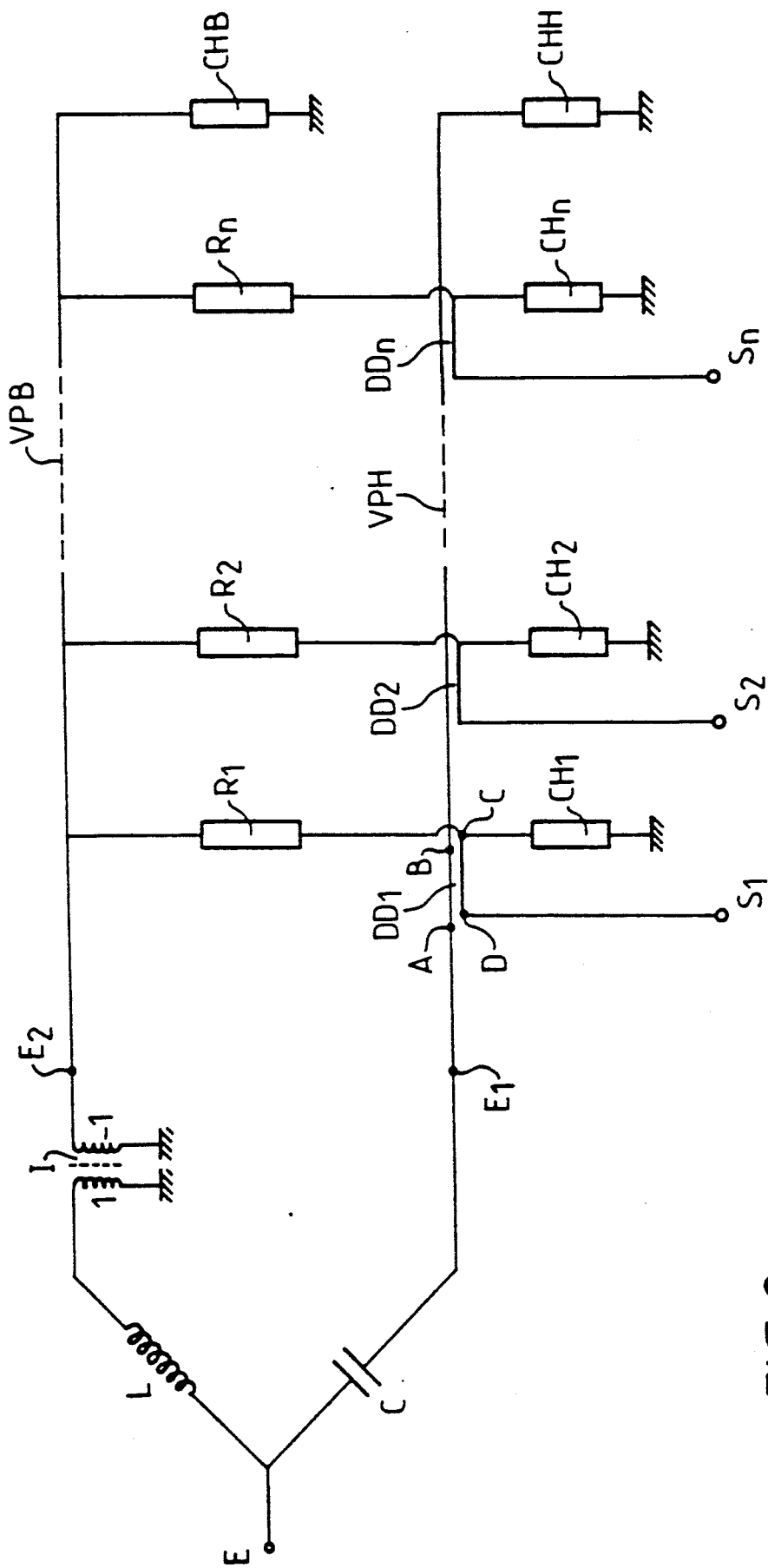
FIG. 2 shows a coupler device with an impedance distributor for distributing signals downstream.

The example of FIG. 2 is a preferred embodiment. Nevertheless certain elements may be arranged differently without passing beyond the scope of the invention: for example the inverter INV may be connected to the high-pass path.

Figure 3:
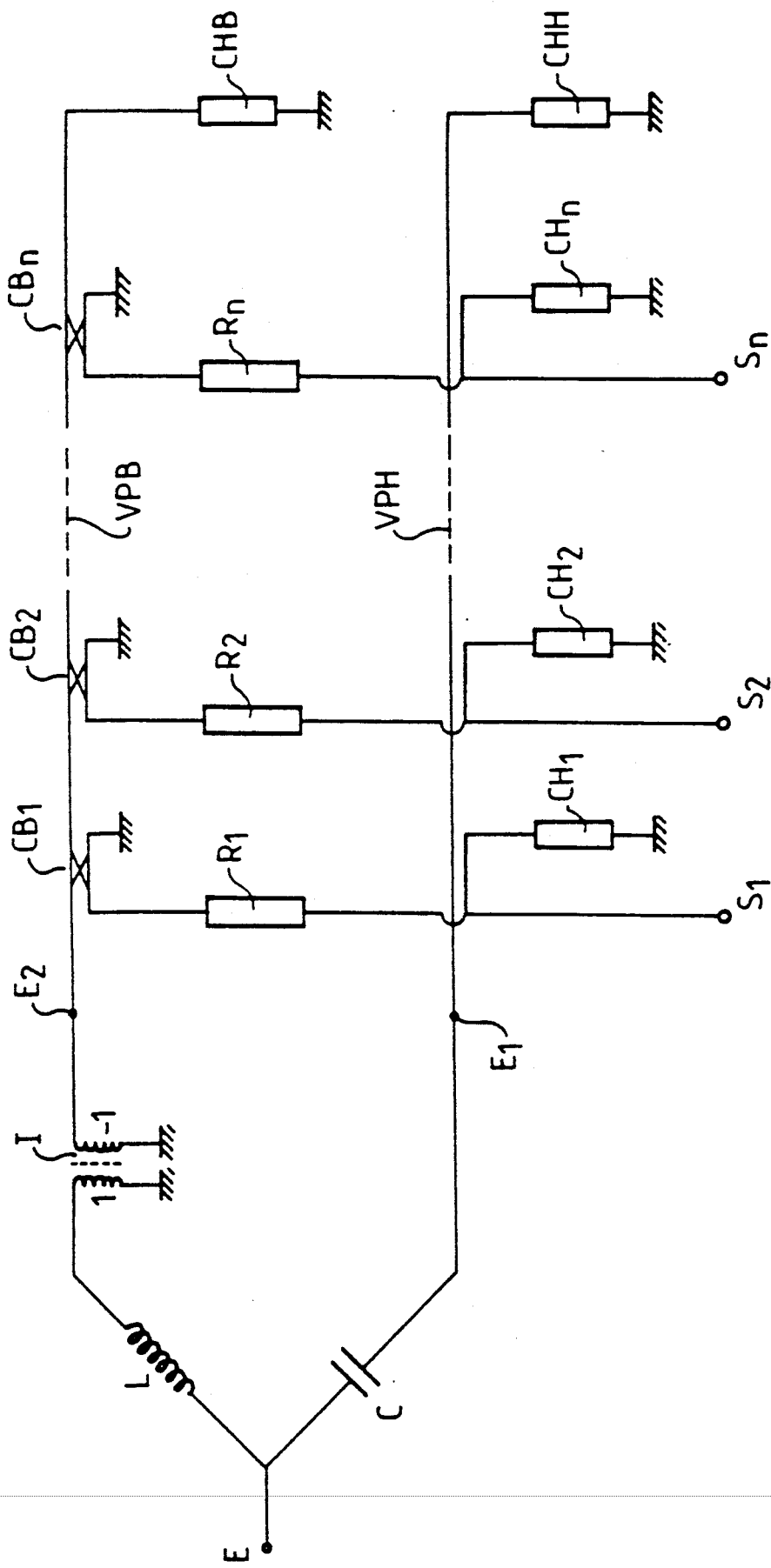
FIG. 3 shows a coupler device with an impedance distributor comprising coil couplers for distributing signals downstream.

The coupler device of FIG. 3 comprises elements which are similar to those of FIG. 2. The impedance star distributor comprises coil couplers $CB_1, CB_2, \ldots CB_n$ for coupling the input $E_2$ to the resistors $R_1, R_2 \ldots R_n$, respectively. The load CHB thus has the value of 75 $\Omega$. By way of example the separation frequency is chosen to be at 800 MHz which, under otherwise equal circumstances, results in new values for the capacitance C of 1.87 pF and the inductance L of 10.4 nH; these values are indicative and not limitative. Preferably, each output of the coil coupler is now connected to the corresponding output of the line coupler and no longer to the load.

I claim:

1. A wideband multiple coupler device for use with signals within a particular frequency range having an input and a plurality of outputs of the same characteristic impedance $Z_0$, constituted by a low-pass path comprising an impedance star distrubutor, and a high-pass path comprising a series arrangement of directional couplers, the outputs of these two paths being pair-wise dc connected to constitute said plurality of outputs, characterized in that the input of the impedance star distributor is connected to said input of the multiple coupler device by means of a first input connection comprising an inductive impedance $Z_1$, in that the input of the cascade arrangement of directional couplers is connected to the input of the multiple coupler device by means of a second input connection comprising a capacitive impedance $Z_c$, in that one of the two input connections is also provided with a phase inverter element connected in series for restoring the phase of signals transmitted over the high-pass path and the low-pass path, throughout the frequency range, and in that $Z_1 \cdot Z_c = Z_0^2$.

2. A multiple coupler device centered at 1750 MHz as claimed in claim 1, wherein the impedances $Z_c$ and $Z_1$ define a frequency referred to as recovery frequency at half the energy, which is approximately 100 MHz, and in that each output of the impedance star distributor is connected to the characteristic impedance $Z_0$ of the corresponding directional coupler output.

3. A multiple coupler device centered at 1750 MHz as claimed in claim 1, wherein the impedance star distributor comprises coil couplers, in that the impedances $Z_c$ and $Z_1$ define a frequency referred to as recovery frequency at half the energy, which is approximately 800 MHz, and in that each output of the coil coupler is connected to the corresponding directional coupler output.

4. A multiple coupler device as claimed in claim 1, wherein the impedance star distributor is used as a return path for transmitting the signals in a direction opposite to the direction of the signals transmitted over the high-pass path.

5. A multiple coupler device as claimed in claim 4, wherein each output of the impedance distributor is connected to a load resistor of a corresponding line coupler output.

6. A multiple coupler device as claimed in claim 5, comprising eight outputs adapted to distribute television signals in a high-pass path of 40 to 860 MHz, a low-pass path of substantially 0 to 40 MHz, with $Z_0 = 75$ $\Omega$, wherein the inductive element has a value of approximately 210 nHenry, the capacitive element has a value of approximately 38 pFarad, the windings of the inverter have a value of several $\mu$Henry, said multiple coupler device further comprising a plurality of loads having a value of 75 $\Omega$, a load CHB having a value of 200 $\Omega$, a plurality of resistors having a value of 1000 $\Omega$ and a plurality of coupled lines each substantially equal to 5 cm.

7. A multiple coupler device as claimed in claim 5, wherein the second input connection comprises inter alia an amplitude correction element.

8. A multiple coupler device as claimed in claim 7, comprising eight outputs adapted to distribute television signals in a high-pass path of 40 to 860 MHz, a low-pass path of substantially 0 to 40 MHz, with $Z_0 = 75$ $\Omega$, wherein the inductive element has a value of approximately 210 nHenry, the capacitive element has a value of approximately 38 pFarad, the windings of the inverter have a value of several $\mu$Henry, said multiple coupler device further comprising a plurality of loads having a value of 75 $\Omega$, a load CHB having a value of 200 $\Omega$, a plurality of resistors having a value of 1000 $\Omega$ and a plurality of coupled lines each substantially equal to 5 cm.

9. A multiple coupler device as claimed in claim 4, wherein the second input connection comprises inter alia an amplitude correction element.

10. A multiple coupler device as claimed in claim 9, comprising eight outputs adapted to distribute television signals in a high-pass path of 40 to 860 MHz, a low-pass path of substantially 0 to 40 MHz, with $Z_0 = 75$ $\Omega$, wherein the inductive element has a value of approximately 210 nHenry, the capacitive element has a value of approximately 38 pFarad, the windings of the inverter have a value of several $\mu$Henry, said multiple coupler device further comprising a plurality of loads having a value of 75 $\Omega$, a load CHB having a value of 200 $\Omega$, a plurality of resistors having a value of 1000 $\Omega$ and a plurality of coupled lines each substantially equal to 5 cm.

11. A multiple coupler device as claimed in claim 4, wherein the phase inverter element is aperiodical.

12. A multiple coupler device as claimed in claim 11, wherein each output of the impedance distributor is connected to a load resistor of a corresponding line coupler output.

13. A multiple coupler device as claimed in claim 11, wherein the second input connection comprises inter alia an amplitude correction element.

14. A multiple coupler device as claimed in claim 11, wherein the phase inverter element is a quadripole having two windings which are mutually coupled and which are situated in the input connection of the impedance distributor, the windings of said quadripole having an impedance $Z_i$ which is much higher than $Z_0$.

15. A multiple coupler device as claimed in claim 14, comprising eight outputs adapted to distribute television signals in a high-pass path of 40 to 860 MHz, a low-pass path of substantially 0 to 40 MHz, with $Z_0 = 75$ $\Omega$, wherein the inductive element has a value of approximately 210 nHenry, the capacitive element has a value of approximately 38 pFarad, the windings of the inverter have a value of several $\mu$Henry, said multiple coupler device further comprising a plurality of loads having a value of 75 $\Omega$, a load CHB having a value of 200 $\Omega$, a plurality of resistors having a value of 1000 $\Omega$ and a plurality of coupled lines each substantially equal to 5 cm.

16. A multiple coupler device as claimed in claim 14, wherein each output of the impedance distributor is connected to a load resistor of a corresponding line coupler output.

17. A multiple coupler device as claimed in claim 14, wherein the second input connection comprises inter alia an amplitude correction element.

18. A multiple coupler device as claimed in claim 14, wherein the modification of the ratio of turns of the phase inverter windings permit of modifying the impedance applied to the impedance star distributor.

19. A multiple coupler device as claimed in claim 18, wherein the second input connection comprises inter alia an amplitude correction element.

20. A multiple coupler device as claimed in claim 18, comprising eight outputs adapted to distribute television signals in a high-pass path of 40 to 860 MHz, a low-pass path of substantially 0 to 40 MHz, with $Z_0 = 75$ $\Omega$, wherein the inductive element has a value of approximately 210 nHenry, the capacitive element has a value of approximately 38 pFarad, the windings of the inverter have a value of several $\mu$Henry, said multiple coupler device further comprising a plurality of loads having a value of 75 $\Omega$, a load CHB having a value of 200 $\Omega$, a plurality of resistors having a value of 1000 $\Omega$ and a plurality of coupled lines each substantially equal to 5 cm.

21. A multiple coupler device as claimed in claim 18, wherein each output of the impedance distributor is connected to a load resistor of a corresponding line coupler output.

22. A multiple coupler device as claimed in claim 21, wherein the second input connection comprises inter alia an amplitude correction element.

23. A multiple coupler device as claimed in claim 21, comprising eight outputs adapted to distribute television signals in a high-pass path of 40 to 860 MHz, a low-pass path of substantially 0 to 40 MHz, with $Z_0 = 75$ $\Omega$, wherein the inductive element has a value of approximately 210 nHenry, the capacitive element has a value of approximately 38 pFarad, the windings of the inverter have a value of several $\mu$Henry, said multiple coupler device further comprising a plurality of loads having a value of 75 $\Omega$, a load CHB having a value of 200 $\Omega$, a plurality of resistors having a value of 1000 $\Omega$ and a plurality of coupled lines each substantially equal to 5 cm.

* * * * *